United States Patent [19]

Deslauriers et al.

[11] Patent Number: 4,937,643
[45] Date of Patent: Jun. 26, 1990

[54] DEVICES HAVING TANTALUM SILICIDE STRUCTURES

[75] Inventors: Jean S. Deslauriers, Bromont, Canada; Hyman J. Levinstein, Berkeley Heights, N.J.

[73] Assignee: American Telephone and Telegraph Company, New York, N.Y.

[21] Appl. No.: 78,013

[22] Filed: Jul. 27, 1987

Related U.S. Application Data

[60] Continuation of Ser. No. 616,915, Jun. 4, 1984, which is a division of Ser. No. 449,441, Dec. 13, 1992, which is a continuation-in-part of Ser. No. 266,433, May 22, 1981, abandoned.

[51] Int. Cl.$^5$ ............................................. H01L 29/78
[52] U.S. Cl. ..................................... 357/23.8; 357/55; 357/59; 357/71; 357/67
[58] Field of Search .................... 357/675, 234, 59, 71, 357/55

[56] References Cited

U.S. PATENT DOCUMENTS 4,488,166 12/1984 Lehrer ................................... 357/67

OTHER PUBLICATIONS

Leung et al.—IEEE–IEDM Tech. Dig.—1980, "Refractory Metal Silicide/N+ Polysilicon in CMOS/-SOS".

Primary Examiner—Edward J. Wojciechowicz
Attorney, Agent, or Firm—Bernard Tiegerman; Glen Books

[57] ABSTRACT

A method for fabricating a device which includes a tantalum silicide structure, and which is essentially free of conductive etch residues, is disclosed. The method includes the steps of depositing tantalum and silicon onto a substrate, patterning the tantalum and silicon, and then sintering the patterned tantalum and silicon to form a patterned layer of tantalum silicide.

1 Claim, 2 Drawing Sheets

U.S. Patent Jun. 26, 1990 4,937,643
FIG. 1
(PRIOR ART)
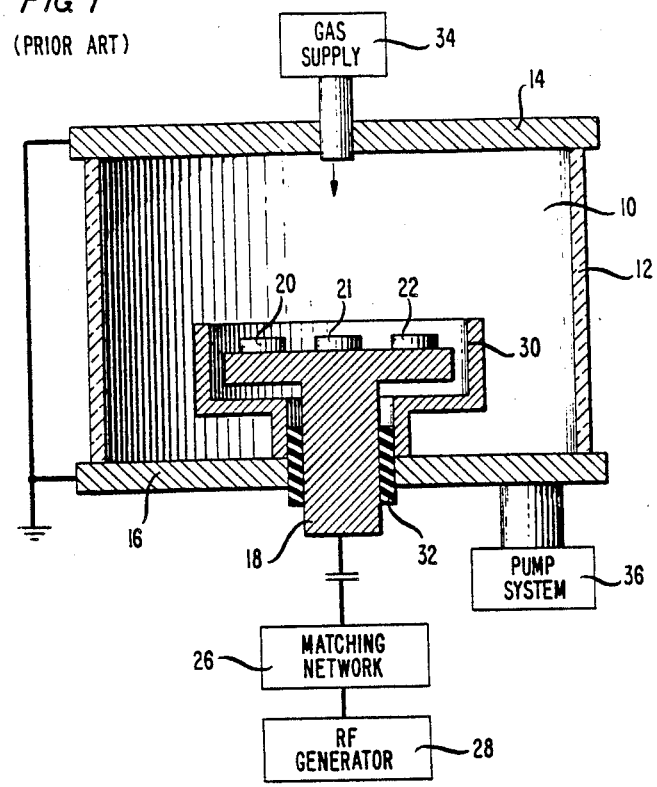
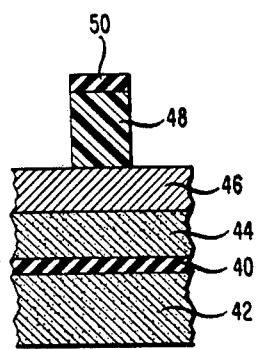
FIG. 2
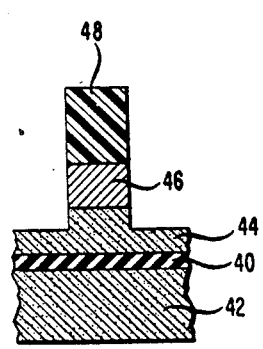
FIG. 3
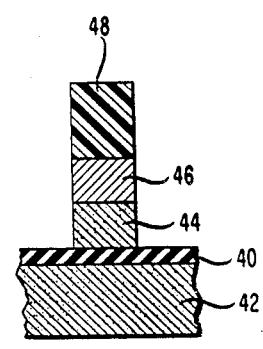
FIG. 4

DEVICES HAVING TANTALUM SILICIDE STRUCTURES

This application is a continuation of application Ser. No. 616,915, filed June 4, 1984, now abandoned, which is a continuation-in-part of U.S. patent application Ser. No. 266,433 filed on May 22, 1981 by Jean S. Deslauriers and Hyman J. Levinstein.

BACKGROUND OF THE INVENTION

1. Field of the Invention

This invention relates to the fabrication of integrated circuits and, more particularly, to techniques for fabricating a high-resolution, composite silicide-on-polysilicon structure in a metal-oxide-semiconductor (MOS) device and to devices made utilizing such techniques.

2. Art Background

It is known to utilize a refractory metal silicide on polysilicon to achieve a high conductivity gate-level metallization for MOS devices. Specific examples of such silicide-on-polysilicon composite structures are described in U.S. Pat. No. 4,276,557 issued to Levinstein et al on June 30, 1981. These examples include a tantalum silicide-on-polysilicon structure formed by plasma etching tantalum silicide and polysilicon in a plasma of $CF_4$ and $O_2$, which plasma produces a generally isotropic etching of the tantalum silicide and polysilicon. Additional details concerning the use of tantalum silicide-on-polysilicon composites in MOS devices are contained in an article by Murarka et al entitled "Refractory Silicides of Titanium and Tantalum for Low-Resistivity Gates and Interconnects," *IEEE Journal of Solid-State Circuits*, Vol. SC-15, No. 4, August 1980, pages 474–482.

A tantalum silicide-on-polysilicon structure is a particularly attractive composite for use in very-large-scale-integrated (VLSI) MOS devices to form, for example, high conductivity, high resolution gate electrodes. The width of these high resolution gate electrodes is typically 2 micrometers ($\mu$m) or smaller. To produce such small features in a composite layer of tantalum silicide-on-polysilicon (which composite layer is typically 1 $\mu$m or less in thickness) requires, for example, methods for anisotropically patterning layers of tantalum silicide and polysilicon, i.e., methods wherein the maximum horizontal undercutting produced during the patterning is less than about one-quarter of the total vertical etch depth. Such anisotropic patterning is desirable to prevent the composite layer of material from being entirely etched away laterally while the material is being etched vertically through its thickness. Accordingly, efforts have been directed at trying to devise anisotropic etching processes, including reactive ion etching processes, for patterning such layers. Heretofore, however, known efforts to devise an effective anisotropic etching process for tantalum silicide-on-polysilicon useful for defining high-resolution features in VLSI devices have not been successful. Moreover, no other methods for producing an anisotropically patterned, composite layer of tantalum slicide-on-polysilicon, other than the methods which attempt to directly, anisotropically etch tantalum silicide and polysilicon, have been available or have, until now, been developed.

SUMMARY OF THE INVENTION

Hence, an object of the present invention is a new process for making devices, and particularly VLSI devices. More specifically, an object of this invention is a new process for fabricating high resolution tantalum silicide-on-polysilicon composite structures for VLSI MOS devices and a new device made by such a process.

Briefly, the invention resides in the discovery that previous attempts to produce useful tantalum silicide-on-polysilicon gates for VLSI MOS devices by reactive ion etching layers of tantalum silicide and polysilicon have failed because conductive etch residues are formed and remain within etch pits produced during the reactive ion etching of the tantalum silicide. Thus, during the operation of the resulting MOS devices, the conductive etch residues can produce a short circuiting of the tantalum silicide-on-polysilicon gates.

The invention also resides in the discovery that an anisotropically patterned layer of tantalum silicide is produced, with essentially no production of conductive etch residues, by depositing tantalum and silicon onto a substrate, anisotropically patterning the tantalum and silicon by means of a reactive ion etching process, and then sintering the patterned tantalum and silicon. The sintering reacts the tantalum and silicon to form tantalum silicide. Thus, the invention yields an anisotropically patterned layer of tantalum silicide, and avoids the need for directly anisotropically etching tantalum silicide. Consequently, the invention is useful for fabricating devices having high resolution tantalum silicide structures, i.e., tantalum silicide structures whose widths are 2 $\mu$m or smaller, which devices are essentially free of conductive etch residues.

The inventive procedure described above is, of course, also useful for fabricating devices having low resolution tantalum silicide structures, i.e., tantalum silicide structures whose widths are greater than 2 $\mu$m. Moreover, the invention also encompasses an alternative procedure for fabricating such low resolution devices. In this alternative procedure tantalum and silicon are also deposited onto a substrate, but then the tantalum and silicon are generally isotropically patterned (the maximum horizontal undercutting is greater than about one-fourth the vertical etch depth) by, for example, conventional plasma etching techniques. Thereafter, the tantalum and silicon is sintered. This alternative procedure is also useful for fabricating devices which are essentially free of conductive etch residues.

In a specific illustrative embodiment of the invention, an anisotropically patterned, composite layer of tantalum silicide-on-polysilicon overlying a gate oxide film is produced by depositing a layer of polysilicon onto the gate oxide film, and then co-depositing tantalum and silicon, in the form of an amorphous mixture, onto the layer of polysilicon. Advantageously, in accordance with an illustrative feature of the invention, etching of the indicated layers is carried out in a two-step sequence before the layers are sintered.

A masking pattern is initially formed on the layer of co-deposited tantalum and silicon. The layer of co-deposited tantalum and silicon is then etched in a reactive ion etching chamber in a plasma that comprises radicals that include fluorine and chlorine as the predominant active etching species for tantalum and silicon, respectively. In a preferred embodiment, the gas introduced into the chamber to form the etching plasma comprises $CCl_3F$.

Illustratively, the layer of co-deposited tantalum and silicon and some but less than all of the underlying polysilicon layer are anisotropically etched in the aforespecified plasma. Subsequently, the remaining polysilicon layer is anisotropically etched in a plasma that is characterized by relatively high selectivity with respect to the underlying gate oxide film. By way of example, this second-mentioned plasma comprises chlorine as the predominant active etching species. After the two-step etching procedure, the layer of co-deposited tantalum and silicon is sintered, reacting the tantalum and silicon to form tantalum silicide. As a result, a composite, anisotropically patterned layer of tantalum silicide-on-polysilicon is produced.

BRIEF DESCRIPTION OF THE DRAWINGS

A complete understanding of the present invention and of the above and other features thereof may be gained from a consideration of the following detailed description presented hereinbelow in connection with the accompanying drawings, in which:

FIG. 1 is a schematic representation of a conventional reactive ion etching apparatus of the type in which applicants' inventive ion etching process is carried out;

FIGS. 2-4 depict the steps involved in a first embodiment of the inventive fabrication process;

DETAILED DESCRIPTION

Figure 5:
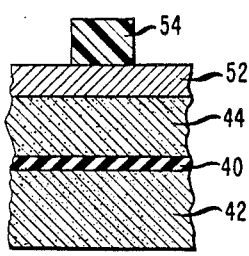
FIGS. 5-8 depict the steps involved in a second embodiment of the inventive fabrication process.

The invention encompasses devices which include a tantalum silicide structure, and which devices are essentially free of conductive etch residues. The invention also encompasses a method for fabricating such devices, which method includes a series of steps for producing a patterned layer of tantalum silicide. The inventive method is useful, for example, for fabricating VLSI MOS devices having high resolution tantalum silicide-on-polysilicon gate electrodes.

In accordance with the inventive fabrication method, a device is formed by a series of steps which include the steps of depositing tantalum and silicon onto a substrate, patterning the tantalum and silicon, and then sintering the patterned tantalum and silicon. The sintering reacts the tantalum and silicon to form tantalum silicide. Thus, a patterned tantalum silicide layer is produced without the need for directly patterning tantalum silicide. Because tantalum silicide is not directly patterned, the formation of conductive etch residues is avoided. Consequently, devices formed in accordance with the invention are essentially free of conductive etch residues.

In a first embodiment of the inventive fabrication method, a device (encompassed by the invention) is formed by a series of steps which include the steps of co-depositing tantalum and silicon, in the form of an amorphous mixture, onto a substrate, patterning the layer containing the tantalum and silicon, and then sintering the patterned layer. The sintering reacts the tantalum and silicon to form a patterned layer of tantalum silicide.

In a second embodiment of the inventive fabrication method, successive layers of polysilicon and tantalum are deposited onto a substrate, the two deposited layers are patterned, and the patterned layers are then sintered. The sintering reacts the patterned tantalum and polysilicon layers to form a patterned tantalum silicide layer.

In a third embodiment of the inventive fabrication method, similar to the second embodiment, only the tantalum layer (or the tantalum layer and a portion of the underlying polysilicon layer) is patterned, and then the patterned tantalum layer and the underlying polysilicon layer are sintered. The sintering yields a patterned tantalum silicide layer overlying an unpatterned polysilicon layer. The polysilicon layer is then patterned using the patterned tantalum silicide layer as an etch mask.

If devices (encompassed by the invention) having high resolution tantalum silicide structures are to be fabricated, then the layer of co-deposited tantalum and silicon, or the successive layers of tantalum and polysilicon, referred to above, are anisotropically patterned using an inventive reactive ion etching process. Of course, the anisotropic reactive ion etching process, in combination with the other inventive fabrication steps, is also useful for fabricating devices (encompassed by the invention) having low resolution tantalum silicide structures. Alternatively, when fabricating devices having low resolution tantalum silicide structures, the layer of co-deposited tantalum and silicon, or the successive layers of tantalum and polysilicon, are generally isotropically patterned by means of conventional plasma etching processes. Either fabrication procedure yields devices which are essentially free of conductive etch residues.

Illustratively, the inventive reactive ion etching process included in applicants' inventive fabrication method is carried out in a standard parallel-plate reactive ion etching apparatus of the type shown in FIG. 1. Alternatively, the reactive ion etching process may also be carried out in the etching equipment disclosed in U.S. Pat. No. 4,298,443 issued to D. Maydan on November 3, 1981, or in the equipment disclosed in U.S. Pat. No. 4,268,374 issued to M. P. Lepselter on May 19, 1981, or in other reactive ion etching equipment known in the art.

The particular illustrative parallel-plate reactor shown in FIG. 1 comprises an etching chamber 10 defined by a cylindrical nonconductive member 12 and two conductive end plates 14 and 16. Illustratively, the member 12 is made of glass and the plates 14 and 16 are made of aluminum and stainless steel, respectively. In addition, the depicted reactor includes a conductive workpiece holder 18 also made, for example, of aluminum. In one illustrative case, the top of the holder 18 constitutes a 10-inch circular surface designed to have seven 3-inch wafers placed thereon. Three such wafers 20 through 22 are shown in FIG. 1.

Advantageously, the surface of the workpiece holder 18 is covered by, for example, a layer of $Al_2O_3$, as disclosed in U.S. patent application Ser. No. 295,531 filed by H. J. Levinstein and F. Vratny on August 24, 1981. Alternatively, the surface of the workpiece holder 18 is covered by, for example, a layer of a polymer sold under the trade name Ardel by the Union Carbide Corporation of Bound Brook, New Jersey, as disclosed in U.S. patent application Ser. No. 295,839 filed by J. M. Moran on August 24, 1981.

The workpiece holder 18 (FIG. 1) is capacitively coupled via a standard matching network 26 to a radio-frequency generator 28 which, by way of example, is designed to drive the holder 18 at a frequency of 13.56 megahertz.

In FIG. 1, the top plate 14 is connected to a point of reference potential such as ground. The plate 14 is the anode of the depicted reactor. The workpiece holder 18 constitutes the driven cathode of the reactor. In one specific illustrative reactor of the type shown in FIG. 1, the anode-to-cathode separation was approximately 6 inches and the diameter of the anode plate 14 was approximately 18 inches.

The base plate 16 of the FIG. 1 arrangement is also connected to ground. Additionally, an open-ended cylindrical shield 30 surrounding the holder 18 is connected to the plate 16 and thus to ground. The portion of the holder 18 that extends through the plate 16 is electrically insulated therefrom by a nonconductive bushing 32.

In accordance with the principles of the present invention, a gaseous atmosphere is established in the chamber 10 of FIG. 1. Gas is controlled to flow into the chamber from a standard supply 34. Additionally, a prescribed low pressure condition is maintained in the chamber 10 by means of a conventional pump system 36.

By introducing a suitable gas into the chamber 10 of FIG. 1 from the supply 34 and establishing an electrical field between the anode 14 and the cathode 18, as specified below, a reactive plasma is generated in the chamber 10. The plasma established therein is characterized by a uniform dark space in the immediate vicinity of the surfaces of the wafers to be etched. Volatile products formed at the wafer surfaces during the etching process are exhausted from the chamber by the system 36.

A portion of one of the wafers 20 through 22, which wafer has been formed in accordance with a first embodiment of the inventive fabrication method, and which wafer is to be anisotropically etched in accordance with the inventive reactive ion etching process in order to form a device, e.g., a VLSI MOS device which includes a high resolution tantalum silicide-on-polysilicon gate electrode, is shown in cross-section in FIG. 2. The depicted portion of the wafer includes, for example, a silicon substrate 42 and a silicon dioxide film 40 (which serves as the gate oxide film) formed on the surface of the substrate 42. Overlying the oxide film 40 is a layer 44 of doped polysilicon, and overlying the polysilicon layer 44 is a layer 46 containing an amorphous mixture of tantalum and silicon.

The silicon dioxide film 40 is formed, for example, by thermally oxidizing the surface of the silicon substrate 42. The polysilicon layer 44 is deposited onto the silicon dioxide film 40 by, for example, conventional low pressure chemical vapor deposition techniques followed by dopant diffusion, e.g., phosphorus diffusion, into the polysilicon. Finally, the layer 46 containing the amorphous mixture of tantalum and silicon is formed, for example, by co-sputtering tantalum and silicon onto the polysilicon layer 44 from separate silicon and tantalum targets. The relative amounts of co-deposited silicon and tantalum in the layer 46 should yield an atomic ratio of silicon to tantalum which is greater than 2 and less than or equal to 3, and preferably greater than or equal to 2.1 but less than or equal to 2.6. Such atomic ratios are readily achieved by controlling the sputtering rates of the silicon and tantalum targets. The prescribed ranges in the atomic ratios of silicon to tantalum are desirable because this ultimately yields a silicon-rich layer of patterned tantalum silicide which exhibits enhanced stability during later processing (not described herein) in oxidizing environments (see U.S. Pat. No. 4,337,476 issued to Fraser et al regarding the advantageous properties of silicon-rich refractory silicides as gate metals). On the other hand, an atomic ratio of silicon to tantalum which is less than 2 is undesirable because the deposited tantalum will react with any silicon dioxide which might have formed on the surface of the polysilicon layer 44 during the deposition procedure, to form tantalum oxide. The presence of tantalum oxide will undesirably increase the resistivity of the tantalum silicide-on-polysilicon gate electrode ultimately produced by the inventive fabrication method. In addition, an atomic ratio of silicon to tantalum which is greater than 3 is undesirable because this ultimately results in a tantalum silicide-on-polysilicon gate whose conductivity is undesirably low.

In forming a device, the thickness of the silicon dioxide film 40, of the wafer shown in FIG. 2, typically ranges from about 50 to about 1000 Angstrom units, and is preferably about 300 Angstrom units. A thickness less than about 50 Angstrom units is undesirable because such a silicon dioxide film 40 will have an undesirably large number of pinholes, while a thickness greater than about 1000 Angstrom units ultimately results in devices whose operating speeds are undesirably low.

The thickness of the polysilicon layer 44 ranges from about 200 to about 6000 Angstrom units, and is preferably about 3500 Angstrom units. Because one of the functions of the polysilicon layer 44 is to act as a barrier (particularly during sintering) to chemical interactions between the tantalum in the layer 46 and the silicon dioxide in the film 40, a polysilicon layer 44 whose thickness is less than about 200 Angstroms is undesirable because such a layer may contain insufficient polysilicon to act as an effective barrier to such chemical interactions. A polysilicon layer 44 whose thickness is greater than about 6000 Angstrom units is undesirable because, among other things, it is relatively difficult to pattern.

The thickness of the layer 46 containing the amorphous mixture of tantalum and silicon ranges from about 1000 to about 3500 Angstrom units, and is preferably about 2500 Angstrom units. It has been found that after the layer 46 is sintered, the resulting tantalum silicide layer will have a corresponding thickness also ranging from about 1000 to about 3500 Angstrom units. A thickness of the layer 46 less than about 1000 Angstroms is undesirable because (after being sintered) the resulting tantalum silicide layer will also have a thickness less than about 1000 Angstroms and, consequently, so little tantalum silicide will be present that the tantalum silicide-on-polysilicon gate electrode will have an undesirably low conductivity. A thickness of the layer 46 greater than about 3500 Angstroms is undesirable because (after being sintered) the resulting tantalum silicide layer will also have a thickness greater than about 3500 Angstroms which, it has been found, results in the tantalum silicide layer being subjected to undesirably high stresses. These stresses, induced by the sintering, can result in mechanical damage to the tantalum silicide layer.

The layers 44 and 46 of FIG. 2 are delineated, in accordance with the inventive reactive ion etching process, by initially forming a patterned masking layer on top of the layer 46. The masking layer may comprise a pattern defined by, for example, standard photolithographic techniques in a 10,000 Angstrom-unit-thick layer of a conventional photoresist such as HPR-204 which is a commercially available positive photoresist made by the Philip A. Hunt Chemical Corporation, of Palisades Park, New Jersey.

It is particularly advantageous, however, to form a masking pattern for the layers 44 and 46 of FIG. 2 by employing the process described by J. M. Moran and D. Maydan in "High Resolution, Steep Profile, Resist Patterns," in *The Bell System Technical Journal*, Volume 58, No. 5, May–June 1979, pages 1027-1036. This process is also described in U.S. Pat. No. 4,244,799 issued to Fraser et al on January 13, 1981. The described process, which is sometimes referred to as the trilevel process, is characterized by submicron resolution with excellent linewidth control and step coverage.

FIG. 2 depicts a high-resolution steep-profile masking pattern made in accordance with the aforespecified trilevel processing sequence. The depicted masking pattern is shown formed in a relatively thick layer 48 made of a hardened organic material. By way of example, the patterned layer 48 is approximately 2.5 micrometers thick and comprises HPR-204 resist baked at about 210 degrees Celsius for approximately 2 hours. Deposited on top of the layer 48 is a so-called intermediate masking layer 50 approximately 1200 Angstrom-units-thick and made, for example, of plasma-deposited silicon dioxide. In prior steps of the standard trilevel process, the layer 50 was selectively etched (in, for example, a reactive ion etching step employing a $CHF_3$ plasma) using a thin overlying high-resolution resist pattern (not shown) as the mask therefor. Illustratively, the high-resolution resist pattern is defined by standard X-ray lithographic techniques in a layer made of a mixture of poly(2,3-dichloro-1-propyl acrylate) and poly(-glycidyl methacrylate-co-ethyl acrylate) also known as DCOPA resist. The pattern in the relatively thin layer 50 was then transferred into the underlying layer 48 to form a corresponding pattern. This last-mentioned transfer was done, for example, in a reactive ion etching step in an $O_2$ plasma, in a manner known in the art.

In accordance with the inventive reactive ion etching process, the masked layer 46 (shown in FIG. 2), which layer consists of an amorphous mixture of tantalum and silicon, is anisotropically patterned in a plasma struck in a gaseous atmosphere which preferably includes $CCl_3F$ gas. $CCl_3F$ is a commercially available gas known as Freon 11 or Halocarbon 11. Alternatively, the plasma is struck in a gaseous atmosphere which includes either $CCl_2F_2$ gas (Freon 12) or $CClF_3$ gas (Freon 13).

Generally, in order to produce the desired plasma, the $CCl_3F$, $CCl_2F_2$, or $CClF_3$ gas should be flowed into the reactor chamber at a flow rate of about 5 to about 100 sccm (standard cubic centimeters per minute), while the total pressure of the gaseous atmosphere within the reactor chamber is maintained at about 2 to about 60 millitorr, and the power density is maintained in the range of about 0.05 to about 1.0 watts/cm$^2$, (watts per square centimeter). Flow rates which are less than about 5 sccm or greater than about 100 sccm are undesirable because such flow rates yield undesirably low etch rates. Moreover, a flow rate greater than about 100 sccm results in undesirably low etching uniformity. A total pressure of the gaseous atmosphere less than about 2 millitorr is undesirable because this also results in an undesirably low etch rate, while a total pressure greater than about 60 millitorr is undesirable because this results in a loss of anisotropic etching (the etching becomes generally isotropic) and results in undesirably low etching uniformity. Finally, a power density less than about 0.05 watts/cm$^2$ is undesirable because this also results in an undesirably low etch rate, while a power density greater than about 1.0 watts/cm$^2$ results in undesirably high resist degradation.

Preferably, the $CCl_3F$, $CCl_2F_2$, or $CClF_3$ gas is flowed into the reactor chamber at 10 to 25 sccm, the pressure of the gaseous atmosphere is maintained at 4 to 20 millitorr, and the power density is maintained in the range 0.15 to 0.4 watts/cm$^2$. While the gaseous atmosphere should contain, for example, $CCl_3F$, $CCl_2F_2$, or $CClF_3$, the gaseous atmosphere may also contain inert gases such as Ar, He, Ne, Ze, or Kr, or other gases such as $Cl_2$, $O_2$, and $N_2$.

By way of example, if $CCl_3F$ gas is flowed into the reactor chamber at 25 sccm, if the pressure of the gaseous atmosphere is maintained at 5 millitorr, and if the power density is 0.2 watts/cm$^2$, then the layer 46 is anisotropically etched (the maximum horizontal undercutting is less than one quarter of the vertical etch depth) at about 2000 Angstrom units per minute.

A generalized contemplated explanation for the aforespecified etching of the layer 46 (which consists of an amorphous mixture of tantalum and silicon) has been an amorphous mixture of tantalum and silicon) has been formulated by applicants. In accordance therewith, reactive ion etching of the unsintered, amorphous mixture of tantalum and silicon in a plasma is deemed to be primarily attributable to radicals that include fluorine and chlorine as the predominant active etching species for tantalum and silicon, respectively. The aforespecified plasmas are illustrative ways of supplying such radicals.

The reactive ion etching process for the layer 46 set forth above is also effective to anisotropically etch the polysilicon layer 44 shown in FIG. 2. Accordingly, in principle, the layer 46 and the polysilicon layer 44 overlying the thin silicon dioxide layer 40 could be both entirely anisotropically patterned utilizing the above-specified plasmas. But the etch rate therein for the amorphous mixture of tantalum and silicon, and the etch rate therein for the polysilicon, relative to the $SiO_2$, is only about 6-to-1. And, since in practice some overetching of the tantalum and silicon mixture-on-polysilicon structure is typically required to clear patterns over stepped surfaces or to compensate for the effects of nonuniform etching across a wafer, a better etch selectivity relative to $SiO_2$ is usually prescribed.

To improve the aforementioned selectivity, thereby to better protect the thin gate oxide layer 40 (FIG. 1) against erosion, it is advantageous but not essential to etch the wafers considered herein in a two-step reactive ion etching process. In the first step, the layer 46 and some part, for example up to approximately one-half, of the underlying polysilicon layer 44 are etched in accordance with the specific process set forth above. At that point, the structure being fabricated appears as indicated in FIG. 3.

Subsequently, to complete the etching of the partially anisotropically patterned polysilicon layer 44 (FIG. 3), the second step of the two-step reactive ion etching process is carried out. Illustratively, this is done by generating a plasma that comprises radicals that include chlorine as the predominant active etching species for the depicted structure. Such a plasma is established, for example, by introducing $Cl_2$ gas into the reactive ion etching chamber. In accordance with the two-step reactive ion etching process, the remainder of the polysilicon layer 44 is anisotropically reactive ion etched by flowing $Cl_2$ gas into the reactor chamber at a flow rate of about 5 to about 100 sccm, by maintaining the total pressure of the gaseous atmosphere at about 2 to about 60 millitorr, and by maintaining the power density in the range of about 0.05 to about 1.0 watts/cm². Operation outside the above-specified ranges is undesirable for the reasons given above. Moreover, a power density greater than about 1.0 watts/cm² results in undesirably low etch selectivity relative to $SiO_2$. Preferably, the $Cl_2$ gas is flowed into the reactor chamber at 10 to 25 sccm, the total pressure of the gaseous atmosphere is maintained at 4 to 20 millitorr, and the power density is maintained in the range 0.15 to 0.4 watts/cm².

By way of example, if $Cl_2$ gas is flowed into the reactor chamber at 15 sccm, if the pressure of the gaseous atmosphere is maintained at 7 millitorr, and if the power density is 0.2 watts/cm², then the polysilicon layer 44 is anisotropically etched at about 1000 Angstrom units per minute. Under these conditions, the polysilicon-to-$SiO_2$ differential etch rate is approximately 22-to-1. Moreover, under these conditions, the previously patterned layer 46 also etches very slowly (at a rate of only about 30 Angstrom units per minute). Hence, the patterned layer 46 serves as an excellent mask for etching the remaining polysilicon.

At the completion of the aforespecified polysilicon etching step, the patterned structure appears as shown in FIG. 4. The resist layer 48 is then removed in a standard way by, for example, chemical dissolution in a mixture of $H_2O_2$ and $H_2SO_4$. Thereafter, the remaining composite gate-level structure is sintered in an inert atmosphere, for example, in pure Argon, at about 800 to about 1100 degrees Celsius and for about 5 to about 120 minutes. Preferably, the structure is sintered in pure Argon at about 900 degrees Celsius and for about 30 minutes. The sintering serves to react the tantalum and silicon in the layer 46 to form tantalum silicide. Thus, an essentially vertical-walled (the maximum lateral displacement of any portion of the sidewall relative to any other portion of the sidewall is less than about one-quarter the height of the sidewall) tantalum silicide-on-polysilicon gate-level structure is produced. The sintering also shrinks the layer 46 slightly, yielding a tantalum silicide layer whose volume and thickness is smaller by about ten percent, or less, than the original volume and thickness of the layer 46. After sintering, the resistivity of one such a specific illustrative composite structure was measured to be approximately 2.2 ohms per square.

In accordance with the second embodiment of the inventive fabrication method, a device having a composite tantalum silicide-on-polysilicon structure is fabricated by forming a wafer, shown in cross-section in FIG. 5, which, as before, includes a silicon substrate 42, a silicon dioxide film 40, and a deposited polysilicon layer 44. However, the second embodiment of the inventive fabrication method differs from the first embodiment in that the wafer of FIG. 5 includes a deposited tantalum layer 52 (and not an amorphous mixture of tantalum and silicon) overlying the polysilicon layer 44. The tantalum layer 52 is deposited onto the polysilicon layer 44 by, for example, conventional sputtering techniques.

In forming a device, the thickness of the silicon dioxide film 40 of the wafer shown in FIG. 5 typically ranges, as before, from about 50 to about 1000 Angstrom units, and is preferably about 300 Angstrom units. Thicknesses less than about 50 Angstroms, and greater than about 1000 Angstroms, are undesirable for the reasons given above.

The thicknesses of the polysilicon and tantalum layers 44 and 52 are dependent on the desired thicknesses of the tantalum silicide and polysilicon layers of the composite structure to be formed in accordance with the inventive fabrication method. The tantalum silicide layer of the composite structure should have a thickness ranging from about 1000 to about 3500 Angstroms, and is preferably about 2500 Angstrom units, while the underlying polysilicon layer (of the composite structure) should have a thickness ranging from about 200 to about 6000 Angstrom units, and is preferably about 3500 Angstrom units. Thicknesses outside these ranges are undesirable for the reasons given above. In general, in order to produce such a composite structure (after sintering), the polysilicon layer 44 should have a thickness ranging from about 1200 to about 9500 Angstroms, while the tantalum layer 52 should have a corresponding thickness ranging from about 400 to about 1400 Angstroms.

Figure 6:
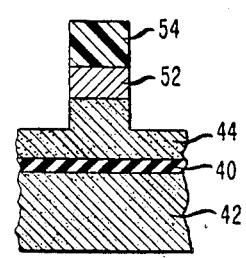
Figure 7:
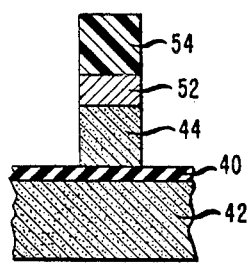

A gate-level metallization pattern is formed in the wafer depicted in FIG. 5 by anisotropically patterning the tantalum and polysilicon layers 52 and 44, in accordance with the inventive reactive ion etching procedure. This patterning is accomplished by depositing a resist 54 (see FIG. 5), such as the organic photoresist HPR-204 or the above-described trilevel resist, onto the tantalum layer 52, and delineating a pattern in the resist. Preferably, the pattern delineated in the resist 54 is transferred into the tantalum and polysilicon layers 52 and 44 using the two-step reactive ion etching procedure described above. That is, during the first step of the two-step etching procedure the tantalum layer 52 and some part, for example, one-half the thickness, of the polysilicon layer 44 is reactive ion etched in a plasma containing active etchant fluorine constituents, e.g., a $CCl_3F$, $CCl_2F_2$, or $CClF_3$ plasma. The resulting structure is shown in FIG. 6. During the second step of the etching procedure, the remainder of the polysilicon layer 44 is anisotropically reactive ion etched in a plasma containing active etchant chlorine constituents, e.g., a $Cl_2$ plasma. The structure resulting from this second step is shown in FIG. 7. This two-step etching procedure effectively protects the thin oxide layer 40 against erosion. The range of flow rates, pressures, and power densities useful in this two-step etching procedure are the same as those described above.

By way of example, if $CCl_3F$ gas is flowed into the reactor chamber at 25 sccm, if the pressure of the gaseous atmosphere is maintained at 5 millitorr, and if the power density is 0.2 watts/cm², then the tantalum layer 52 is anisotropically etched at about 2000 Angstrom units per minute.

At the completion of the two-step etching procedure, the wafer is removed from the reactive ion etching chamber and the resist layer 54 is removed by conventional techniques, e.g., conventional chemical dissolution techniques.

During the final step in the second embodiment of the inventive fabrication process, the processed wafer is sintered in an inert atmosphere, for example, in pure Argon, at about 800 to about 1100 degrees Celsius, and for about 5 to about 120 minutes. Preferably, the sintering is done in pure Argon at about 900 degrees Celsius for about one hour. This results in the anisotropically patterned tantalum layer 52 and a portion of the anisotropically patterned polysilicon layer 44 chemically combining to form an anisotropically patterned tantalum silicide layer 58 overlying an anisotropically patterned layer of polysilicon 56 (which, in turn, overlies the silicon dioxide film 40), as shown in FIG. 8.

Figure 8:
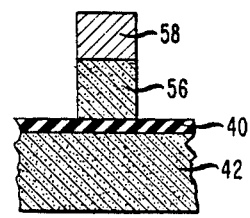

Control samples, similar to the wafer shown in FIG. 5, are used to determine what the appropriate thicknesses of the tantalum layer 52 and the polysilicon layer 44 (see FIG. 5) should be to produce particular desired thicknesses of the tantalum silicide layer 58 and the polysilicon layer 56 (see FIG. 8). For example, cross-sectional slices of sintered control samples are analyzed by means of transmission electron microscopy to determine the thicknesses of tantalum silicide layer 58 and polysilicon layer 56 resulting from prescribed thicknesses of the tantalum layer 52 and polysilicon layer 44. Using such control samples it has been found, for example, that if, prior to sintering, the patterned tantalum layer 52 had a thickness of about 1000 Angstrom units, and the patterned polysilicon layer 44 had a thickness of about 6000 Angstroms units, then after sintering the resulting anisotropically patterned tantalum silicide layer 58 will have a thickness of about 2500 Angstrom units, while the anisotropically patterned polysilicon layer 56 will have a thickness of about 3500 Angstrom units.

Figure 9:
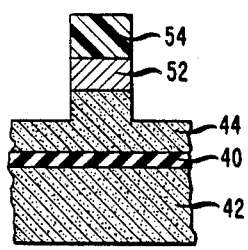
FIGS. 9-10 depict the steps involved in a third embodiment of the inventive fabrication process.
Figure 10:
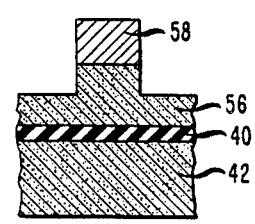

In a third embodiment of the inventive fabrication method, which is similar to the second embodiment described above, just the tantalum layer 52, or the tantalum layer 52 and a portion of the polysilicon layer 44, e.g., half the thickness of the polysilicon layer 44, are patterned using, for example, the first step of the two-step etching process described above. The resulting structure is shown in FIG. 9. Thereafter, the resist layer 54 is removed and the tantalum and polysilicon layers are sintered, as described above, which results in the formation of a patterned tantalum silicide layer 58 overlying a polysilicon layer 56, which layer 56 is only partially patterned, as shown in FIG. 10. Finally, the remainder of the polysilicon layer 56 is etched in a plasma containing active etchant chlorine constituents, as described above, using the patterned tantalum silicide layer 58 as an etch mask.

The steps involved in the fabrication of a device having low resolution tantalum silicide structures, e.g., low resolution tantalum silicide-on-polysilicon gates, are generally identical to those described above. While the inventive reactive ion etching process described above may be used to do the patterning, conventional plasma etching techniques are also useful. Whichever patterning procedure is used, the resulting devices will be essentially free of conductive etch residues. As emphasized herein, the key to achieving such residue-free devices is to carry out the sintering step needed to produce tantalum silicide after patterning at least the tantalum in such devices.

Finally, it is to be understood that the above-described techniques are only illustrative of the principles of the present invention. In accordance with these principles, numerous modifications and alternatives may be devised by those skilled in the art without departing from the spirit and scope of the invention.

EXAMPLE 1

The first embodiment of the inventive fabrication method was used to form an anisotropically patterned, composite layer of silicon-rich tantalum silicide-on-polysilicon overlying a silicon dioxide film. The pattern consisted of an array of 2-micron lines and spaces. The workpiece was a 3-inch silicon wafer which had been thermally oxidized to form a layer of $SiO_2$, approximately 1200 Angstrom units thick, on the surface of the wafer. A layer of polysilicon, about 3500 Angstrom units thick, had also been deposited onto the oxidized surface of the wafer by conventional low pressure chemical vapor deposition techniques. In addition, a layer of an amorphous mixture of tantalum and silicon, about 2500 Angstrom units thick, had been deposited onto the layer of polysilicon by co-sputtering tantalum and silicon onto the polysilicon layer from separate tantalum and silicon targets. The sputter rates of the tantalum and silicon were controlled to produce an atomic ratio of silicon to tantalum of about 2.2.

The first embodiment of the inventive fabrication method was initiated by spinning a 1 μm-thick layer of HPR-204 photoresist onto the layer of the amorphous mixture of tantalum and silicon, which photoresist was purchased from the Philip A. Hunt Chemical Corporation of Palisades Park, New Jersey. The photoresist was baked for about 20 minutes at about 90 degrees Celsius. A pattern of 2-micron lines and spaces was then defined in the photoresist by exposing the photoresist to UV light (wavelength equal to 3100 Angstroms) through a mask, and then developing the resist with a wet developer which is sold under the trade name LSI Developer by the Philip A. Hunt Chemical Corporation. The photoresist was again baked for about 30 minutes at about 140 degrees Celsius.

The workpiece was then placed on the power electrode of a parallel plate, reactive ion etching machine of the type described above, which power electrode constituted the cathode of the machine. The surface of the power electrode was circular and had a diameter of about 10 inches. The spacing between the power electrode and the opposed wall of the grounded reactor chamber, which wall constituted the anode of the machine, was about 6 inches. $CCl_3F$ gas was then flowed into the reactor chamber at 25 sccm, the pressure of the gaseous atmosphere within the reactor chamber was maintained at 5 millitorr, and a 13.56 MHz rf signal was applied to the power electrode to produce a power density of 0.2 watts/cm$^2$. The reactive ion etching was continued for about 3 minutes. This length of time was sufficient, from a prior knowledge of the etch rates of the amorphous mixture of tantalum and silicon (about 2000 Angstroms/min.) and the polysilicon (about 1000 Angstroms/min.) in this plasma, to etch through the full thickness of the tantalum-and-silicon layer and through about half the thickness of the polysilicon layer.

The reactor chamber was then purged, and the workpiece was then reactive ion etched in the same reactive ion etching machine but in a $Cl_2$ atmosphere. That is, $Cl_2$ gas was flowed into the reactor chamber at 15 sccm, the pressure of the gaseous atmosphere within the reactor chamber was maintained at 7 millitorr, and a 13.56 MHz rf signal was applied to the power electrode. The resulting reactive ion etching of the polysilicon was continued for about 2.5 minutes which, from a prior knowledge of the etch rate of polysilicon (about 1000 Angstroms/min.) in the plasma, was known to be sufficient to etch through the remaining thickness of the polysilicon and, in fact, to overetch the polysilicon.

The workpiece was removed from the reactor chamber, and the photoresist was dissolved by the conventional steps of dipping the workpiece for about 10 minutes into a bath of boiling $NH_4OH$, $H_2O_2$, and water, rinsing, and again dipping the workpiece for about 10 minutes into a bath of boiling HCl, $H_2O_2$, and water. The workpiece was then sintered in an Argon atmosphere at about 900 degrees Celsius for about 30 minutes to form a patterned, composite layer of silicon-rich tantalum silicide-on-polysilicon. From previous analyses, which involved transmission and scanning electron microscopic studies, it was known that the sintering had produced a silicon-rich tantalum silicide layer about 2300 Angstrom units thick overlying a polysilicon layer about 3500 Angstrom units thick.

Cleaved samples of the workpiece were then placed in a scanning electron microscope, and scanning electron micrographic photographs were taken. The photographs showed that the walls of the etch pits in the composite layer of tantalum silicide-on-polysilicon were essentially vertical. In addition, the photographs showed no observable etch residues within the etch pits.

EXAMPLE 2

The second embodiment of the inventive fabrication method was also used to form an anisotropically patterned, composite layer of tantalum silicide-on-polysilicon overlying a silicon dioxide film. The pattern also consisted of an array of 2-micron lines and spaces. The workpiece was a 3-inch silicon wafer which had been thermally oxidized to form a layer of $SiO_2$, approximately 1200 Angstrom units thick, on the surface of the wafer. In addition, a layer of polysilicon, about 6000 Angstrom units thick, had been deposited onto the oxidized surface of the wafer by conventional low pressure chemical vapor deposition techniques, and a layer of tantalum, about 1000 Angstrom units thick, had been sputter deposited onto the polysilicon.

The second embodiment of the inventive fabrication method was initiated by spinning a 1 μm-thick layer of HPR-204 photoresist onto the tantalum layer. A pattern of 2-micron lines and spaces was then defined in the photoresist by prebaking the resist, by exposing the resist to UV light through a mask, developing the resist, and then postbaking the resist, as in Example 1.

The workpiece was then placed on the power electrode of the parallel plate, reactive ion etching machine described in Example 1, and then etched in the $CCl_3F$ plasma described in Example 1. The reactive ion etching was continued for 3½ minutes. This length of time was sufficient, from a prior knowledge of the etch rates of tantalum (2000 Angstroms/min.) and polysilicon (1000 Angstroms/min.) in this plasma to etch through the full thickness of the tantalum layer and through about half the thickness of the polysilicon.

The reactor chamber was then purged, and the workpiece was then reactive ion etched in the $Cl_2$ plasma described in Example 1. The reactive ion etching of the polysilicon was continued for about 4 minutes which, from a prior knowledges of the etch rate of the polysilicon (1000 Angstroms/min.) in this plasma, was known to be sufficient to etch through the remaining thickness of the polysilicon.

The workpiece was removed from the reactor chamber, and the photoresist was chemically dissolved using the procedure described in Example 1. The workpiece was then sintered in an Argon atmosphere at about 900 degrees Celsius for about one hour to form a patterned, composite layer of tantalum silicide-on-polysilicon. From previous analyses, which involved transmission and scanning electron microscopic studies, it was known that the sintering procedure had produced a tantalum silicide layer about 2500 Angstrom units thick overlying a polysilicon layer about 3500 Angstrom units thick.

Cleaved samples of the workpiece were then placed in a scanning electron microscope, and scanning electron micrographic photographs were taken. The photographs showed that the walls of the etch pits in the composite layer of tantalum silicide-on-polysilicon were essentially vertical. In addition, the photographs showed no observable etch residues within the etch pits.

What is claimed is:

1. A device, comprising:
   a substrate including semiconductor material; and
   a field effect transistor (FET) including a source, a drain, a gate insulator and a gate formed in and on said substrate, said gate insulator comprising a layer of silicon oxide and said gate comprising a polysilicon layer on said gate insulator over a region of said substrate between said source and said drain, said gate including on said polysilicon a layer of tantalum silicide, CHARACTERIZED IN THAT
   said layer of tantalum silicide has at least one essentially vertical wall where the maximum lateral displacement of any portion of said wall relative to any other portion of said wall is less than about one-quarter the height of the wall, and said FET is essentially free of conductive etch residues.

* * * * *

UNITED STATES PATENT AND TRADEMARK OFFICE
CERTIFICATE OF CORRECTION

PATENT NO. : 4,937,643

DATED : June 26, 1990

INVENTOR(S) : Jean S. Deslauriers and Hyman J. Levinstein

It is certified that error appears in the above-identified patent and that said Letters Patent is hereby corrected as shown below:

TITLE PAGE: [60] "1992" should read 1982

Column 1, line 6 after "abandoned," add --which is a division of application Ser. No. 449,441, filed December 13, 1982, now abandoned,--
Column 3, line 20 after "inventive" insert --reactive--
Column 11, line 54 "deviced" should read --devised--
Column 14, line 5 "knowledges" should read --knowledge--

Signed and Sealed this

Seventeenth Day of December, 1991

Attest:

HARRY F. MANBECK, JR.

*Attesting Officer*       *Commissioner of Patents and Trademarks*